(12) United States Patent
Hung et al.

(10) Patent No.: US 8,922,028 B2
(45) Date of Patent: Dec. 30, 2014

(54) SEMICONDUCTOR PACKAGE

(75) Inventors: Sung-Ching Hung, Kaohsiung (TW); Wen-Pin Huang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 311 days.

(21) Appl. No.: 13/088,117

(22) Filed: Apr. 15, 2011

(65) Prior Publication Data

US 2011/0193209 A1  Aug. 11, 2011

Related U.S. Application Data

(63) Continuation-in-part of application No. 12/029,521, filed on Feb. 12, 2008, now abandoned.

(30) Foreign Application Priority Data

Feb. 13, 2007 (TW) ............................... 96105162 A

(51) Int. Cl.
| | |
|---|---|
| *H01L 23/495* | (2006.01) |
| *H01L 23/13* | (2006.01) |
| *H01L 23/31* | (2006.01) |
| *H01L 23/498* | (2006.01) |
| *H01L 23/00* | (2006.01) |
| *H01L 23/50* | (2006.01) |

(52) U.S. Cl.
CPC ............ *H01L 23/13* (2013.01); *H01L 23/3121* (2013.01); *H01L 23/4952* (2013.01); *H01L 23/49541* (2013.01); *H01L 23/49838* (2013.01); *H01L 24/06* (2013.01); *H01L 24/49* (2013.01); *H01L 23/3107* (2013.01); *H01L 23/49503* (2013.01); *H01L 23/50* (2013.01); *H01L 24/45* (2013.01); *H01L 24/48* (2013.01); *H01L 2224/05553* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/0603* (2013.01); *H01L 2224/32145* (2013.01); *H01L 2224/32225* (2013.01);

(Continued)

(58) Field of Classification Search
USPC .......................................................... 257/784
See application file for complete search history.

(56) References Cited

U.S. PATENT DOCUMENTS

| | | | | |
|---|---|---|---|---|
| 4,963,974 | A | * | 10/1990 | Ushio et al. .................... 257/750 |
| 5,422,435 | A | * | 6/1995 | Takiar et al. ................... 174/521 |

(Continued)

*Primary Examiner* — Eugene Lee
(74) *Attorney, Agent, or Firm* — Foley & Lardner, LLP; Cliff Z. Liu; Angela D. Murch

(57) ABSTRACT

The present invention relates to a semiconductor package, comprising a carrier, a semiconductor device, a first wire and a second wire. The carrier has a first electrically connecting portion and a second electrically connecting portion. The semiconductor device has a plurality of pads. The first wire electrically connects one of the pads of the semiconductor device and the first electrically connecting portion of the carrier, and the first wire has a first length. The second wire electrically connects one of the pads of the semiconductor device and the second electrically connecting portion of the carrier, and the second wire has a second length. The second length is larger than the first length, and the diameter of the second wire is larger than that of the first wire. Thus, the material usage for the wire is reduced, and the manufacturing cost is reduced.

18 Claims, 13 Drawing Sheets

(52) U.S. Cl.
CPC .............. *H01L 2224/32233* (2013.01); *H01L 2224/32245* (2013.01); *H01L 2224/45144* (2013.01); *H01L 2224/45147* (2013.01); *H01L 2224/48091* (2013.01); *H01L 2224/48145* (2013.01); *H01L 2224/48227* (2013.01); *H01L 2224/48237* (2013.01); *H01L 2224/48247* (2013.01); *H01L 2224/48257* (2013.01); *H01L 2224/4903* (2013.01); *H01L 2224/49051* (2013.01); *H01L 2224/49171* (2013.01); *H01L 2224/49175* (2013.01); *H01L 2224/49505* (2013.01); *H01L 2224/73265* (2013.01); *H01L 2924/01028* (2013.01); *H01L 2924/01029* (2013.01); *H01L 2924/0103* (2013.01); *H01L 2924/01046* (2013.01); *H01L 2924/01047* (2013.01); *H01L 2924/01079* (2013.01); *H01L 2924/01082* (2013.01); *H01L 2224/48233* (2013.01); *H01L 2224/48253* (2013.01); *H01L 2224/48644* (2013.01); *H01L 2224/48839* (2013.01); *H01L 2224/48844* (2013.01); *H01L 2224/48847* (2013.01); *H01L 2224/48855* (2013.01); *H01L 2224/48864* (2013.01); *H01L 2224/48647* (2013.01); *H01L 2224/48665* (2013.01); *H01L 2224/48664* (2013.01); *H01L 2224/48639* (2013.01); *H01L 2224/4813* (2013.01); *H01L 2224/4911* (2013.01)

USPC .......................................................... 257/784

(56) References Cited

U.S. PATENT DOCUMENTS

| | | | |
|---|---|---|---|
| 5,552,966 A * | 9/1996 | Nagano ........................ | 361/813 |
| 5,895,977 A | 4/1999 | Banerjee | |
| 6,159,765 A * | 12/2000 | Drehobl et al. ................ | 438/106 |
| 6,169,329 B1 * | 1/2001 | Farnworth et al. ............. | 257/780 |
| 6,326,235 B1 * | 12/2001 | Glenn ........................... | 438/106 |
| 6,441,501 B1 * | 8/2002 | Tseng et al. ................... | 257/784 |
| 6,476,506 B1 * | 11/2002 | O'Connor et al. ............ | 257/786 |
| 6,534,879 B2 | 3/2003 | Terui | |
| 6,544,880 B1 | 4/2003 | Akram | |
| 6,674,177 B2 * | 1/2004 | Schoenfeld ................... | 257/784 |
| 6,682,954 B1 * | 1/2004 | Ma et al. ....................... | 438/109 |
| 6,798,075 B2 | 9/2004 | Liaw et al. | |
| 6,812,580 B1 * | 11/2004 | Wenzel et al. ................ | 257/784 |
| 6,815,789 B2 | 11/2004 | Tiziani et al. | |
| 6,836,002 B2 * | 12/2004 | Chikawa et al. .............. | 257/666 |
| 6,858,920 B2 * | 2/2005 | Hatauchi ....................... | 257/666 |
| 6,900,551 B2 | 5/2005 | Matsuzawa et al. | |
| 6,979,905 B2 * | 12/2005 | Nishida et al. ................ | 257/777 |
| 7,211,903 B2 * | 5/2007 | Miyaki et ..................... | 257/784 |
| 7,259,467 B2 | 8/2007 | Inagawa | |
| 7,326,594 B2 * | 2/2008 | Beauchamp et al. ......... | 438/123 |
| 7,443,011 B2 * | 10/2008 | Cusack et al. ................ | 257/666 |
| 7,598,599 B2 * | 10/2009 | Chow et al. .................. | 257/666 |
| 7,675,165 B2 * | 3/2010 | Heberle et al. ................ | 257/723 |
| 2003/0042621 A1 | 3/2003 | Chen et al. | |
| 2004/0227226 A1 | 11/2004 | Hsu | |
| 2005/0012226 A1 | 1/2005 | Chang et al. | |
| 2005/0200009 A1 | 9/2005 | Kang et al. | |
| 2005/0242356 A1 | 11/2005 | Catalasan | |

* cited by examiner

US 8,922,028 B2

SEMICONDUCTOR PACKAGE

CROSS REFERENCE TO RELATED APPLICATION

This application is a Continuation-In-Part of prior patent application Ser. No. 12/029,521, filed Feb. 12, 2008, which is hereby incorporated by reference herein.

BACKGROUND OF THE INVENTION

1. Field of the Invention

The present invention relates to a semiconductor package, and more particularly to a semiconductor package having wires with different diameters.

2. Description of the Related Art

FIG. 1 shows a top view of a conventional semiconductor package without a molding compound. FIG. 2 shows a cross-sectional view of the conventional semiconductor package. The conventional semiconductor package 1 comprises a substrate 11, a die 12, a plurality of wires 13 and a molding compound 14.

The upper surface of the substrate 11 has a plurality of fingers 111, a ground ring 112 and a power ring 113. The fingers 111, the ground ring 112 and the power ring 113 surround the die 12. The lower surface of the die 12 is adhered to the upper surface of the substrate 11 by an adhesive 15. The upper surface of the die 12 has a plurality of first-row pads 121 and a plurality of second-row pads 122. The first-row pads 121 are connected to the ground ring 112 or the power ring 113 via the wires 13. The second-row pads 122 are connected to the fingers 111 via the wires 13. The molding compound 14 encapsulates the upper surface of the substrate 11, the die 12 and the wires 13.

The conventional semiconductor package 1 has the following disadvantages. The diameters of the wires 13 are the same, causing a waste of material. In particular, the material of the conventional wires is almost always gold, and this increases the manufacturing cost. Moreover, the sizes of the first-row pads 121 and the second-row pads 122 are the same, and so the amount of the pads cannot increase, and the semiconductor device has less flexibility in layout.

Therefore, it is necessary to provide an innovative and advanced semiconductor package to solve the above problems.

SUMMARY OF THE INVENTION

The present invention is directed to a semiconductor package, which comprises a carrier, a semiconductor device, a first wire and a second wire. The carrier has a first electrically connecting portion and a second electrically connecting portion. The semiconductor device has a plurality of pads. The first wire electrically connects one of the pads of the semiconductor device and the first electrically connecting portion of the carrier, and the first wire has a first length. The second wire electrically connects one of the pads of the semiconductor device and the second electrically connecting portion of the carrier, and the second wire has a second length. The second length is larger than the first length, and the diameter of the second wire is larger than that of the first wire. Thus, the material usage for the wires is reduced, and the manufacturing cost is reduced.

DETAILED DESCRIPTION OF THE INVENTION

Figure 1:
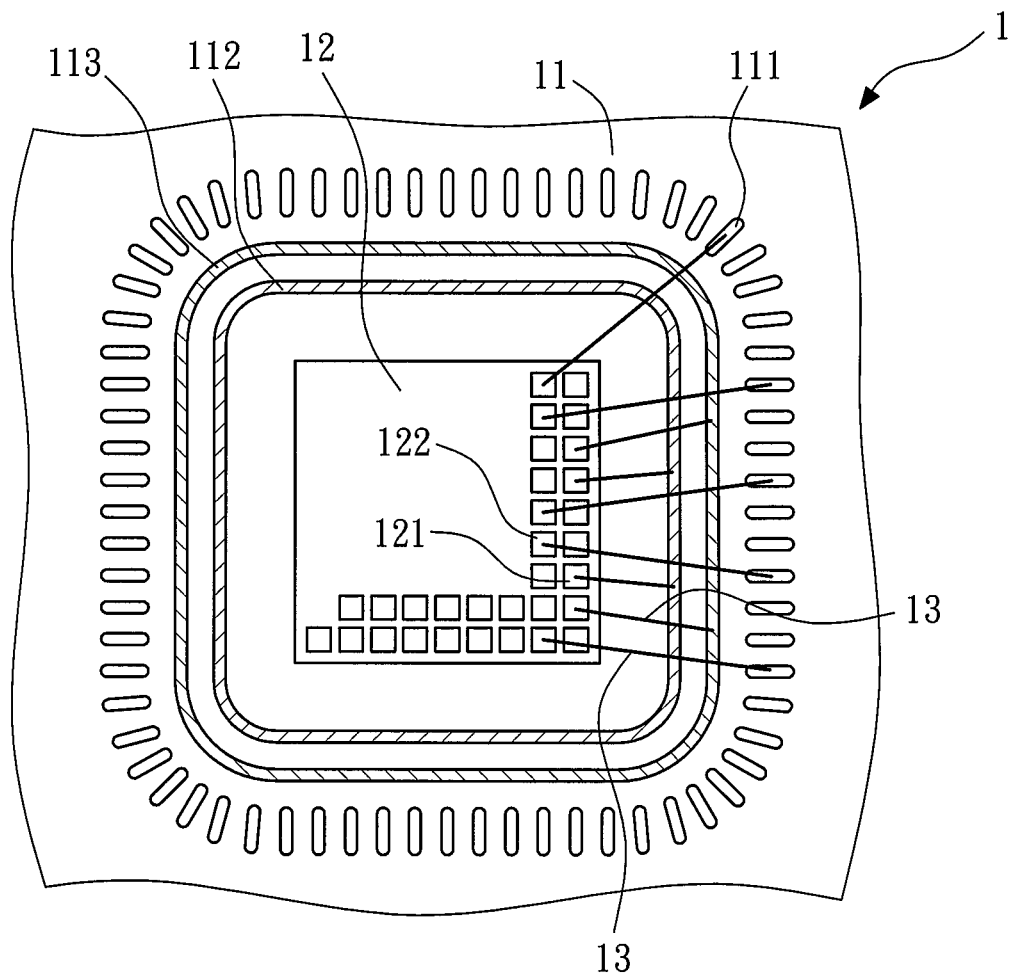
FIG. 1 is a schematic top view of a conventional semiconductor package without a molding compound.
Figure 2:
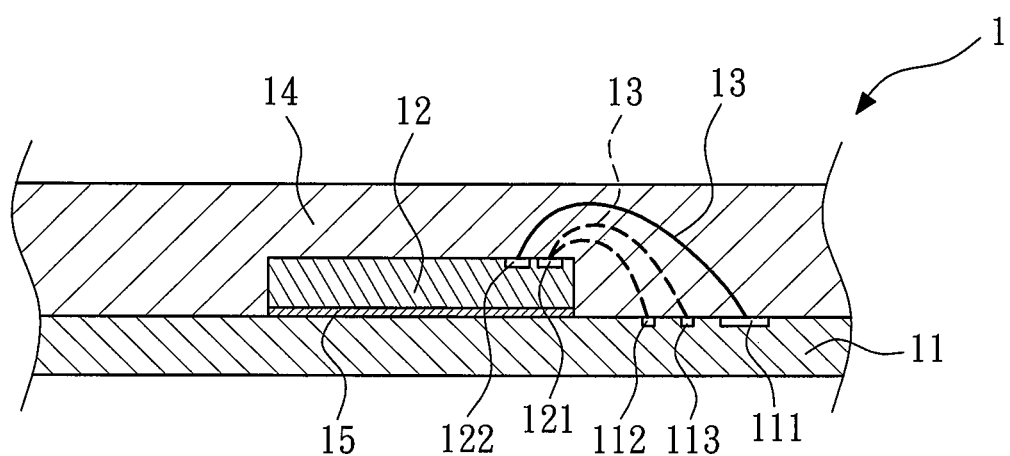
FIG. 2 is a schematic cross-sectional view of the conventional semiconductor package.

The present invention relates to a semiconductor package, which comprises a carrier, a semiconductor device, a first wire and a second wire.

The carrier has a first electrically connecting portion and a second electrically connecting portion. In the present invention, the carrier may be a substrate or a leadframe. When the carrier is a substrate, the semiconductor device may be directly adhered to the upper surface of the substrate, or, alternatively, the substrate has a through hole, and the semiconductor device is disposed in the through hole. Meanwhile, both the first electrically connecting portion and the second electrically connecting portion are fingers, or the first electrically connecting portion is a ground ring or a power ring, and the second electrically connecting portion is a finger.

When the carrier is a leadframe, which has a die pad, the semiconductor device is adhered to the die pad. Meanwhile, both the first electrically connecting portion and the second electrically connecting portion are leads, or the first electrically connecting portion is a ground ring or a power ring, and the second electrically connecting portion is a lead.

The semiconductor device has a plurality of pads. The semiconductor device is preferably a die, and the areas of the pads are different. When the pads are arranged into one row, the pads at least comprise a first pad and a second pad, wherein the area of the first pad is smaller than that of the second pad. When the pads are arranged into rows, the pads at least comprise a first-row pad and a second-row pad, and the area of the first-row pad is smaller than that of the second-row pad.

The first wire electrically connects one of the pads of the semiconductor device and the first electrically connecting portion of the carrier, and the first wire has a first length. The second wire electrically connects one of the pads of the semiconductor device and the second electrically connecting portion of the carrier, and the second wire has a second length. The second length is larger than the first length, and the diameter of the second wire is larger than that of the first wire. For example, the diameter of the first wire is smaller than 0.9 times the diameter of the second wire. The diameter of the first wire is designed according to its strength, so that the first wire maintains its form in the molding procedure against the molding material flow. The area of the pad contacted by the second wire is preferably larger than that of the pad contacted by the first wire.

The present invention has the following advantages. The diameter of the second wire is different from that of the first wire, so that the material usage for the wire is reduced, and the manufacturing cost is reduced. Moreover, the areas of the pads of the semiconductor device are different, so that the size of the semiconductor device is reduced, and the flexibility in layout of the semiconductor package is increased.

The present invention is illustrated in detail by the following examples, but it's not restricted by the content of the examples.

Example 1

Figure 3:
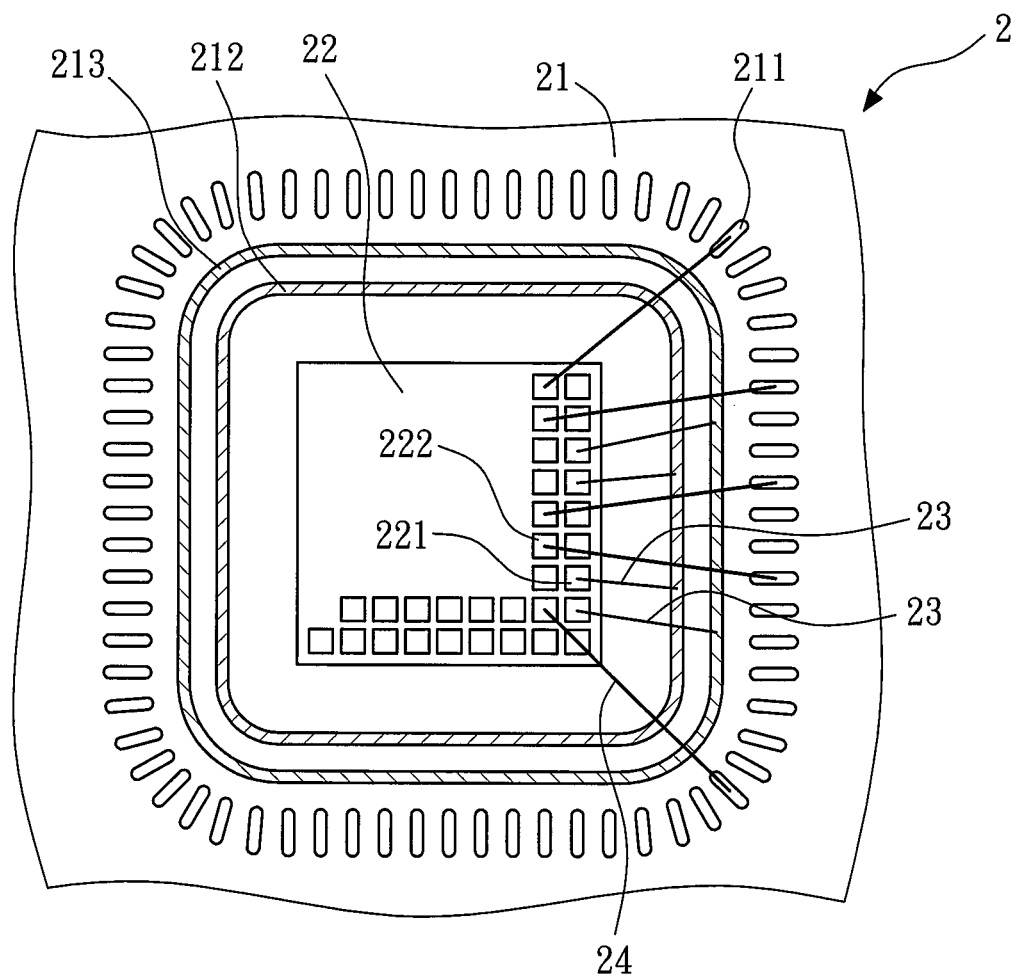
FIG. 3 is a schematic top view of a semiconductor package according to example 1 of the present invention without the molding compound.
Figure 4:
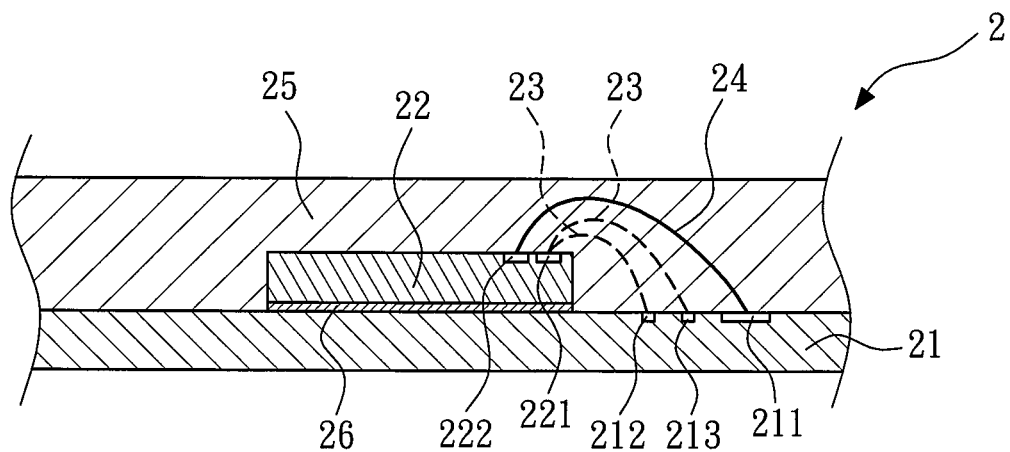
FIG. 4 is a schematic cross-sectional view of a semiconductor package according to example 1 of the present invention.

FIG. 3 shows a top view of a semiconductor package according to example 1 of the present invention without the molding compound. FIG. 4 shows a cross-sectional view of a semiconductor package according to example 1 of the present invention. The semiconductor package 2 comprises a substrate 21, a die 22, a plurality of first wires 23, a plurality of second wires 24 and a molding compound 25.

The upper surface of the substrate 21 has a first electrically connecting portion and a second electrically connecting portion. In the example, the first electrically connecting portion is a ground ring 212 or a power ring 213, and the second electrically connecting portion is a plurality of second fingers 211. The second fingers 211, the ground ring 212 and the power ring 213 surround the die 22.

The lower surface of the die 22 is adhered to the upper surface of the substrate 21 by an adhesive 26. The upper surface of the die 22 has a plurality of pads, wherein the pads are arranged into two rows, and the pads comprise a plurality of first-row pads 221 and a plurality of second-row pads 222. The areas of the first-row pads 221 and the second-row pads 222 are the same.

The first wires 23 electrically connect the first-row pads 221 and the ground ring 212 or the power ring 213, and each of the first wires 23 has a first length. The second wires 24 electrically connect the second-row pads 222 and the second fingers 211, and each of the second wires 24 has a second length. The second length is larger than the first length, and the diameters of the second wires 24 are larger than those of the first wires 23. The molding compound 25 encapsulates the upper surface of the substrate 21, the die 22, the first wires 23, the second wires 24, the ground ring 212, the power ring 213, the second fingers 211, the first-row pads 221 and the second-row pads 222.

Example 2

Figure 5:
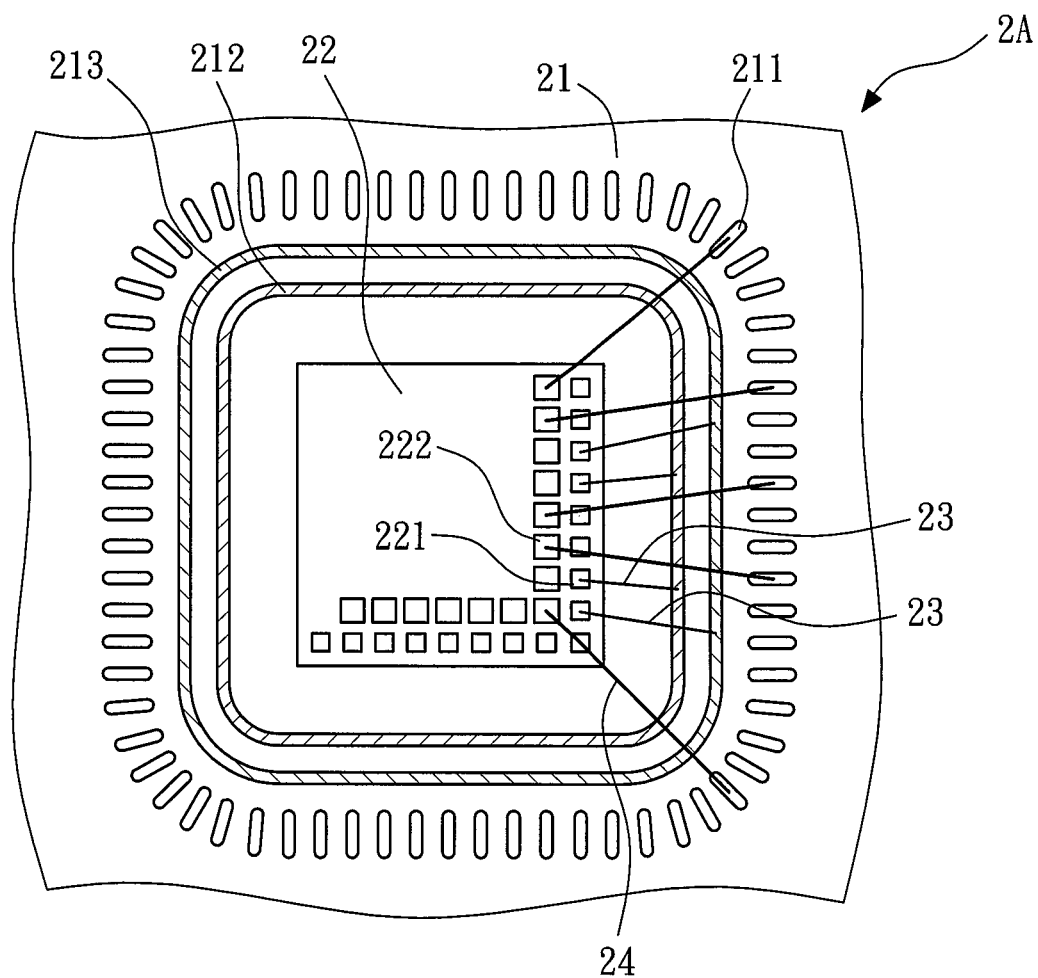
FIG. 5 is a schematic top view of a semiconductor package according to example 2 of the present invention without the molding compound.

FIG. 5 shows a top view of a semiconductor package according to example 2 of the present invention without the molding compound. The semiconductor package 2A of the example is substantially the same as the semiconductor package 2 of example 1, except that the areas of the first-row pads 221 are smaller than those of the second-row pads 222 in the example.

Example 3

Figure 6:
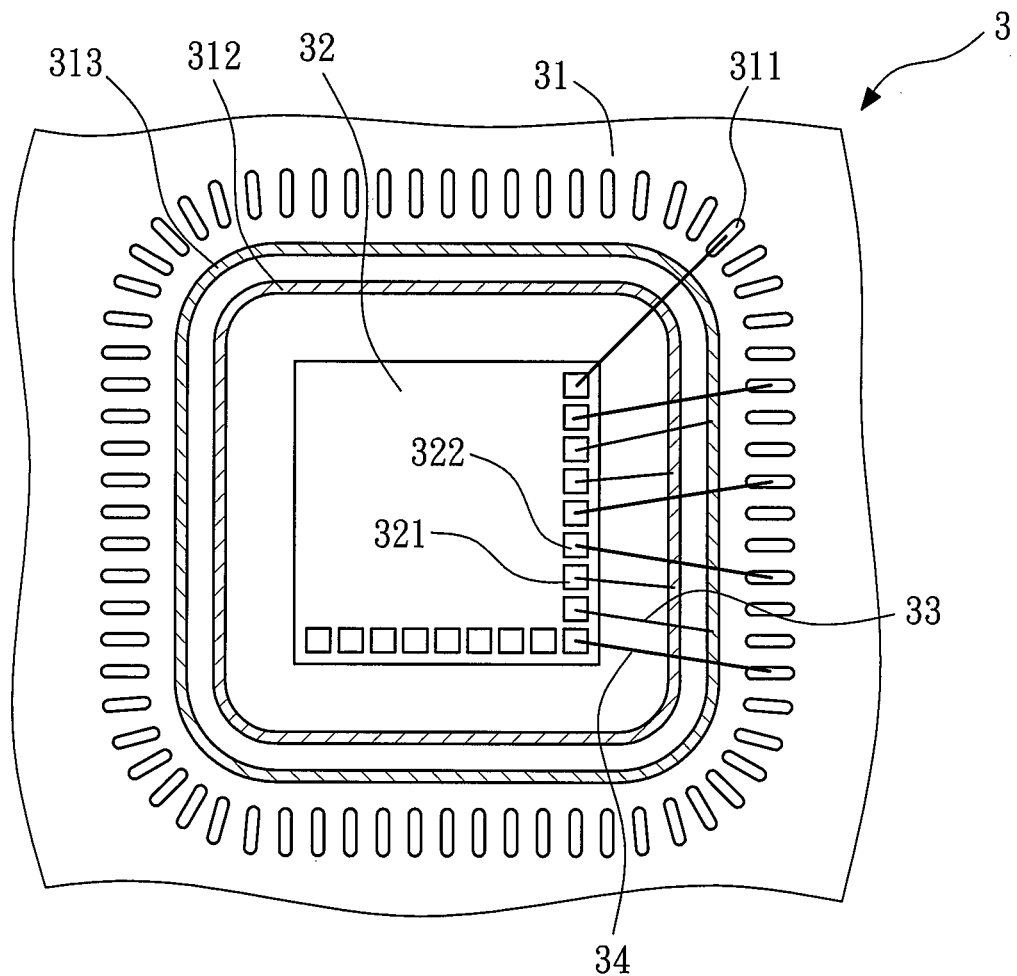
FIG. 6 is a schematic top view of a semiconductor package according to example 3 of the present invention without the molding compound.

FIG. 6 shows a top view of a semiconductor package according to example 3 of the present invention without the molding compound. The semiconductor package 3 comprises a substrate 31, a die 32, a plurality of first wires 33, a plurality of second wires 34 and a molding compound (not shown).

The upper surface of the substrate 31 has a first electrically connecting portion and a second electrically connecting portion. In the example, the first electrically connecting portion is a ground ring 312 or a power ring 313, and the second electrically connecting portion is a plurality of second fingers 311. The second fingers 311, the ground ring 312 and the power ring 313 surround the die 32.

The lower surface of the die 32 is adhered to the upper surface of the substrate 31 by an adhesive (not shown). The upper surface of the die 32 has a plurality of pads, wherein the pads are arranged into one row, and the pads comprise a plurality of first pads 321 and a plurality of second pads 322. The areas of the first pads 321 and the second pads 322 are the same.

The first wires 33 electrically connect the first pads 321 and the ground ring 312 or the power ring 313, and each of the first wires 33 has a first length. The second wires 34 electrically connect the second pads 322 and the second fingers 311, and each of the second wires 34 has a second length. The second length is larger than the first length, and the diameters of the second wires 34 are larger than those of the first wires 33.

Example 4

Figure 7:
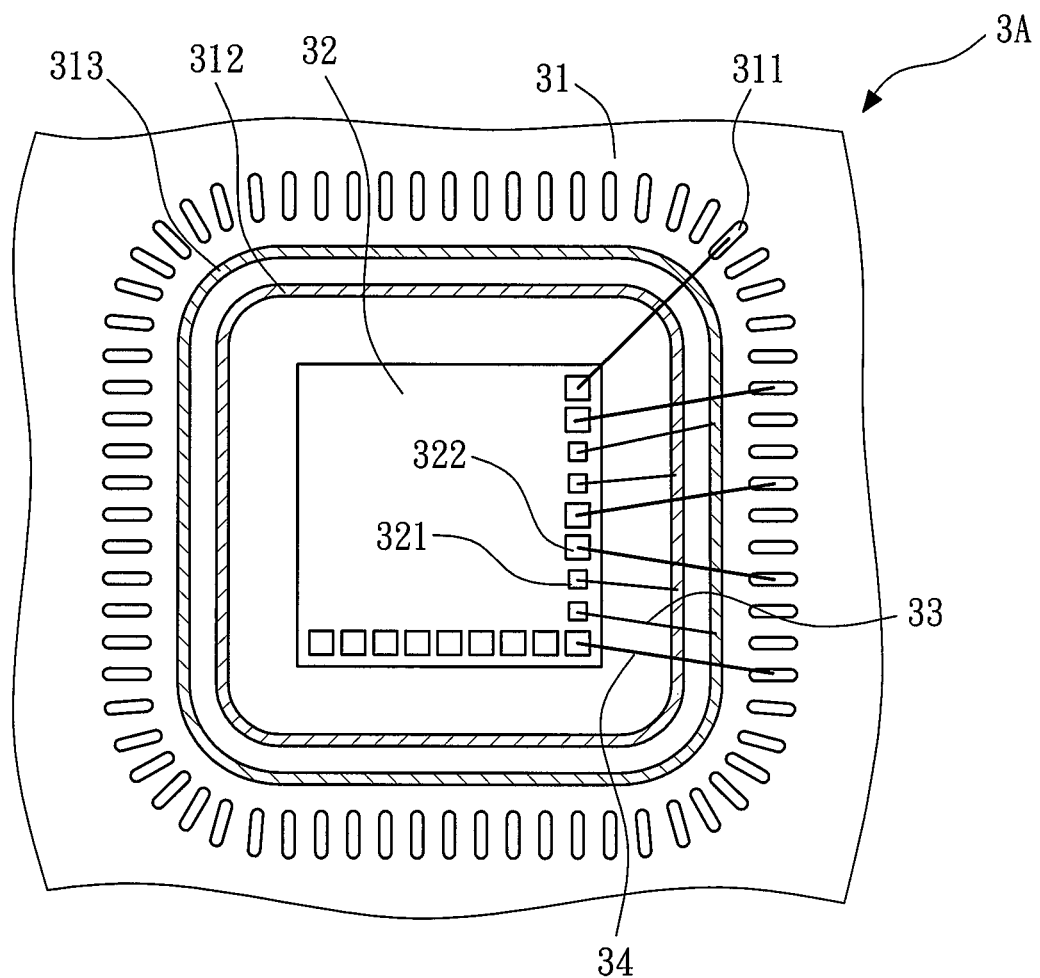
FIG. 7 is a schematic top view of a semiconductor package according to example 4 of the present invention without the molding compound.

FIG. 7 shows a top view of a semiconductor package according to example 4 of the present invention without the molding compound. The semiconductor package 3A of the example is substantially the same as the semiconductor package 3 of example 3, except that the areas of the first pads 321 in the example are smaller than those of the second pads 322.

Example 5

Figure 8:
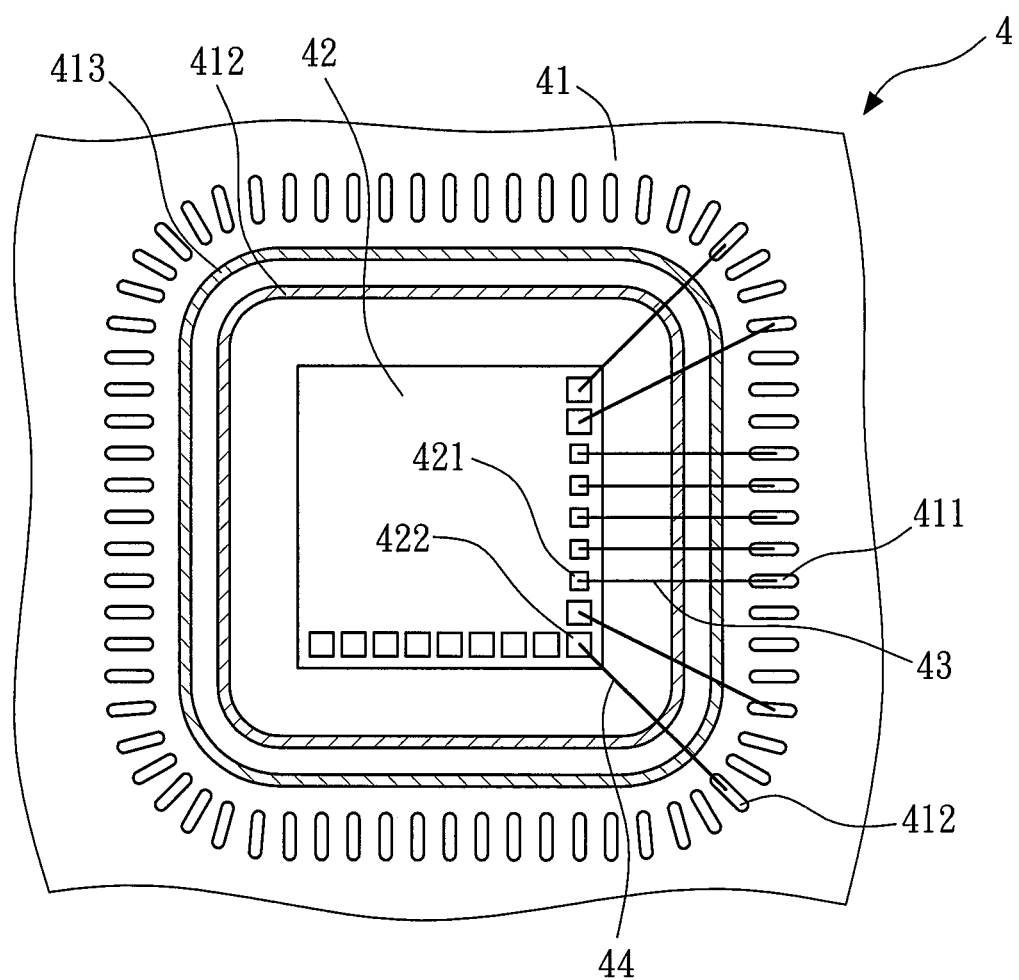
FIG. 8 is a schematic top view of a semiconductor package according to example 5 of the present invention without the molding compound.

FIG. 8 shows a top view of a semiconductor package according to example 5 of the present invention without the molding compound. The semiconductor package 4 comprises a substrate 41, a die 42, a plurality of first wires 43, a plurality of second wires 44 and a molding compound (not shown).

The upper surface of the substrate 41 has a first electrically connecting portion and a second electrically connecting portion. In the example, the first electrically connecting portion is a plurality of first fingers 411, and the second electrically connecting portion is a plurality of second fingers 412. The first fingers 411 and the second fingers 412 surround the die 42.

The lower surface of the die 42 is adhered to the upper surface of the substrate 41 by an adhesive (not shown). The upper surface of the die 42 has a plurality of pads, wherein the pads are arranged into one row, and the pads comprise a plurality of first pads 421 and a plurality of second pads 422. The areas of the first pads 421 are smaller than those of the second pads 422. It is understood that the areas of the first pads 421 may also be equal to those of the second pads 422.

The first wires 43 electrically connect the first pads 421 and the first fingers 411, and each of the first wires 43 has a first length. The second wires 44 electrically connect the second pads 422 and the second fingers 412, and each of the second wires 44 has a second length. The second length is larger than the first length, and the diameters of the second wires 44 are larger than those of the first wires 43.

Example 6

Figure 9:
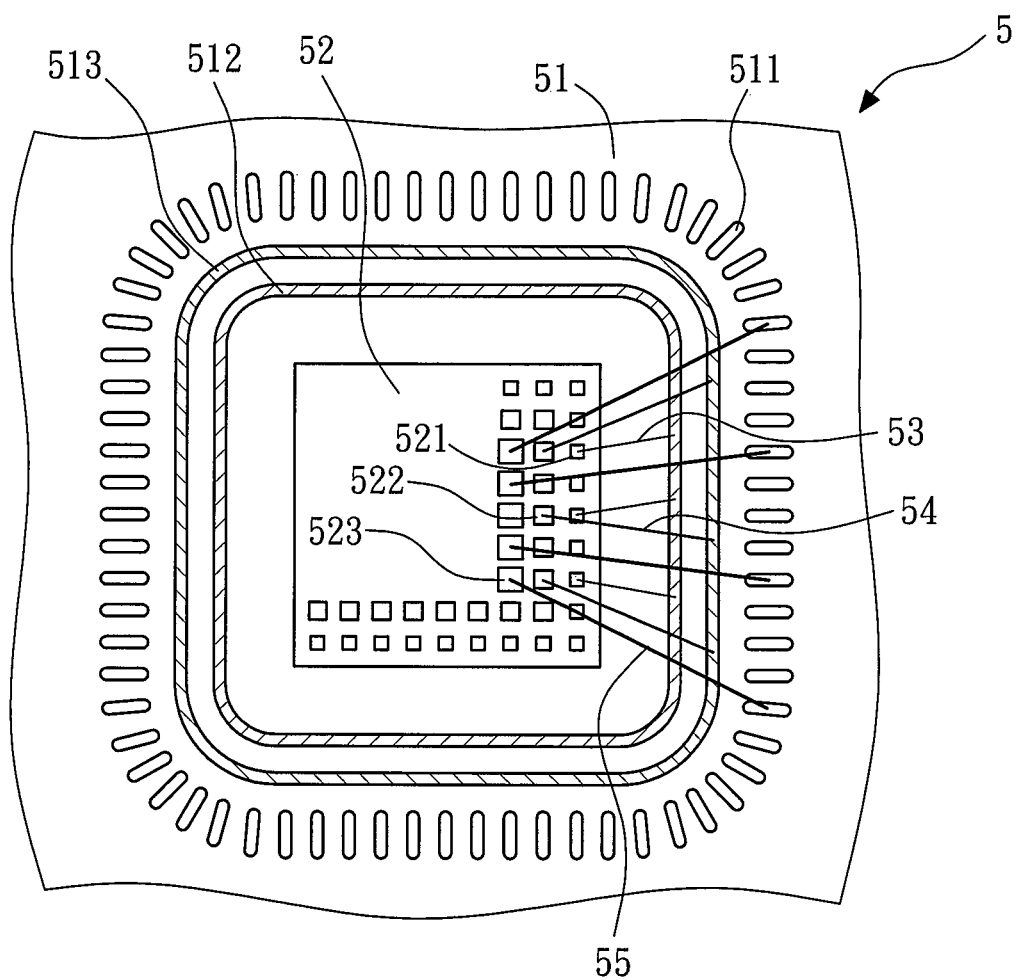
FIG. 9 is a schematic top view of a semiconductor package according to example 6 of the present invention without the molding compound.

FIG. 9 shows a top view of a semiconductor package according to example 6 of the present invention without the molding compound. The semiconductor package 5 comprises a substrate 51, a die 52, a plurality of first wires 53, a plurality of second wires 54, a plurality of third wires 55 and a molding compound (not shown).

The upper surface of the substrate 51 has a first electrically connecting portion, a second electrically connecting portion and a third electrically connecting portion. In the example, the first electrically connecting portion is a ground ring 512, the second electrically connecting portion is a power ring 513, and the third electrically connecting portion is a plurality of fingers 511. The fingers 511, the ground ring 512 and the power ring 513 surround the die 52.

The lower surface of the die 52 is adhered to the upper surface of the substrate 51 by an adhesive (not shown). The upper surface of the die 52 has a plurality of pads, wherein the pads are arranged into three rows, and the pads comprise a plurality of first-row pads 521, a plurality of second-row pads 522 and a plurality of third-row pads 523. The areas of the first-row pads 521 are smaller than those of the second-row pads 522, and the areas of the second-row pads 522 are smaller than those of the third-row pads 523. It is understood that the areas of the first-row pads 521, the second-row pads 522 and the third-row pads 523 may be the same.

The first wires 53 electrically connect the first-row pads 521 and the ground ring 512, and each of the first wires 53 has a first length. The second wires 54 electrically connect the second-row pads 522 and the ground ring 513, and each of the second wires 54 has a second length. The third wires 55 electrically connect the third-row pads 523 and the fingers 511, and each of the third wires 55 has a third length. The third length is larger than the second length, and the second length is larger than the first length. The diameters of the third wires 55 are larger than those of the second wires 54, and the diameters of the second wires 54 are larger than those of the first wires 53.

Example 7

Figure 10:
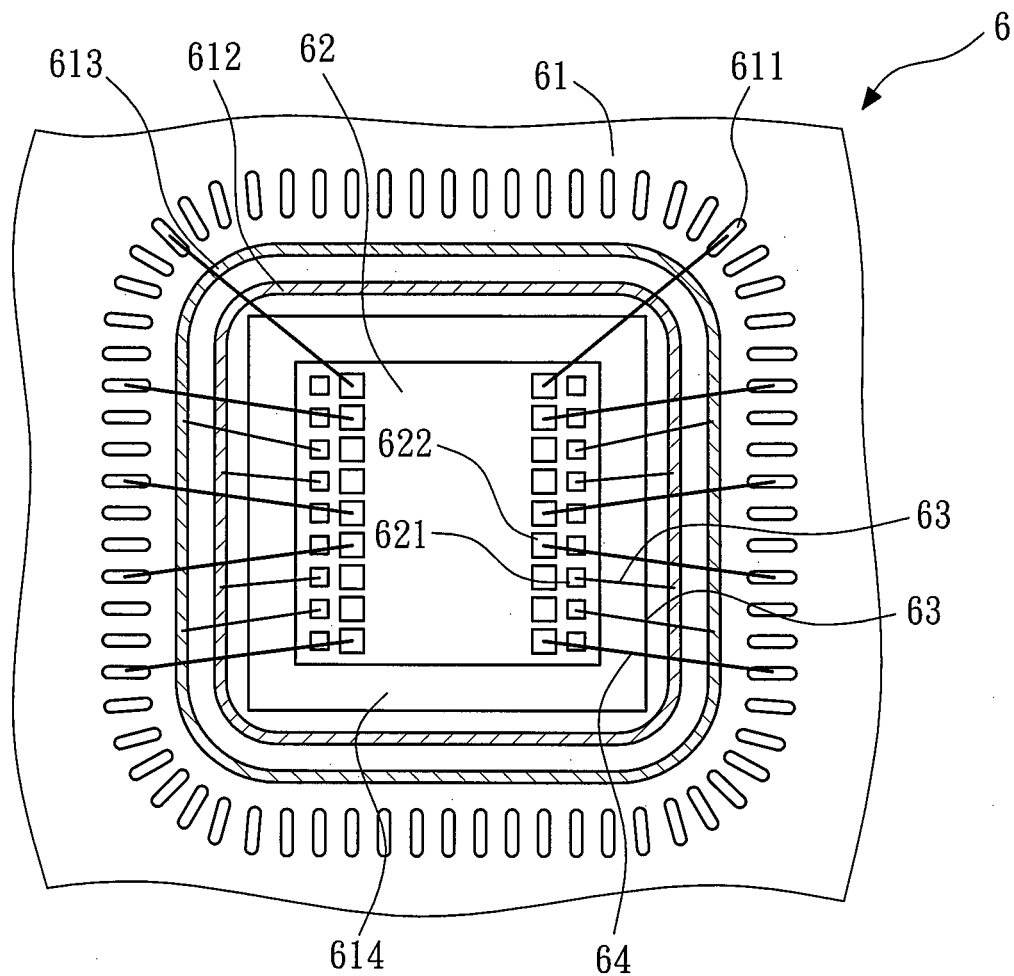
FIG. 10 is a schematic top view of a semiconductor package according to example 7 of the present invention without the molding compound.
Figure 11:
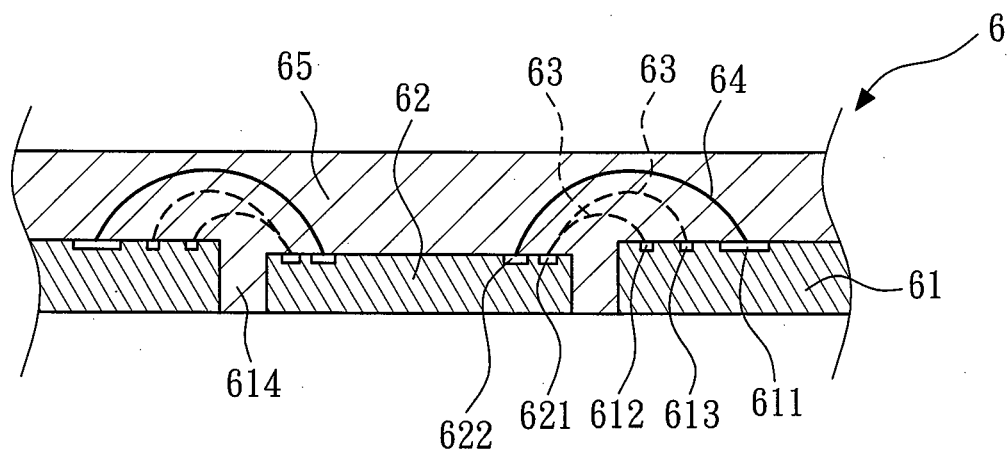
FIG. 11 is a schematic cross-sectional view of a semiconductor package according to example 7 of the present invention.

FIG. 10 shows a top view of a semiconductor package according to example 7 of the present invention without the molding compound. FIG. 11 shows a cross-sectional view of a semiconductor package according to example 7 of the present invention. The semiconductor package 6 comprises a substrate 61, a die 62, a plurality of first wires 63, a plurality of second wires 64 and a molding compound 65.

The upper surface of the substrate 61 has a first electrically connecting portion and a second electrically connecting portion. In the example, the first electrically connecting portion is a ground ring 612 or a power ring 613, and the second electrically connecting portion is a plurality of fingers 611. The fingers 611, the ground ring 612, and the power ring 613 surround the die 62.

The substrate 61 has a through hole 614, and the die 62 is disposed in the through hole 614. The upper surface of the die 62 has a plurality of pads, wherein the pads are arranged into two rows, and the pads comprise a plurality of first-row pads 621 and a plurality of second-row pads 622. The areas of the first-row pads 621 are smaller than those of the second-row pads 622.

The first wires 63 electrically connect the first-row pads 621 and the ground ring 612 or the power ring 613, and each of the first wires 63 has a first length. The second wires 64 electrically connect the second-row pads 622 and the fingers 611, and each of the second wires 64 has a second length. The second length is larger than the first length, and the diameters of the second wires 64 are larger than those of the first wires 63. The molding compound 65 encapsulates the upper surface of the substrate 61, the die 62, the first wires 63, the second wires 64, the ground ring 612, the power ring 613, the fingers 611, the first-row pads 621 and the second-row pads 622.

Example 8

Figure 12:
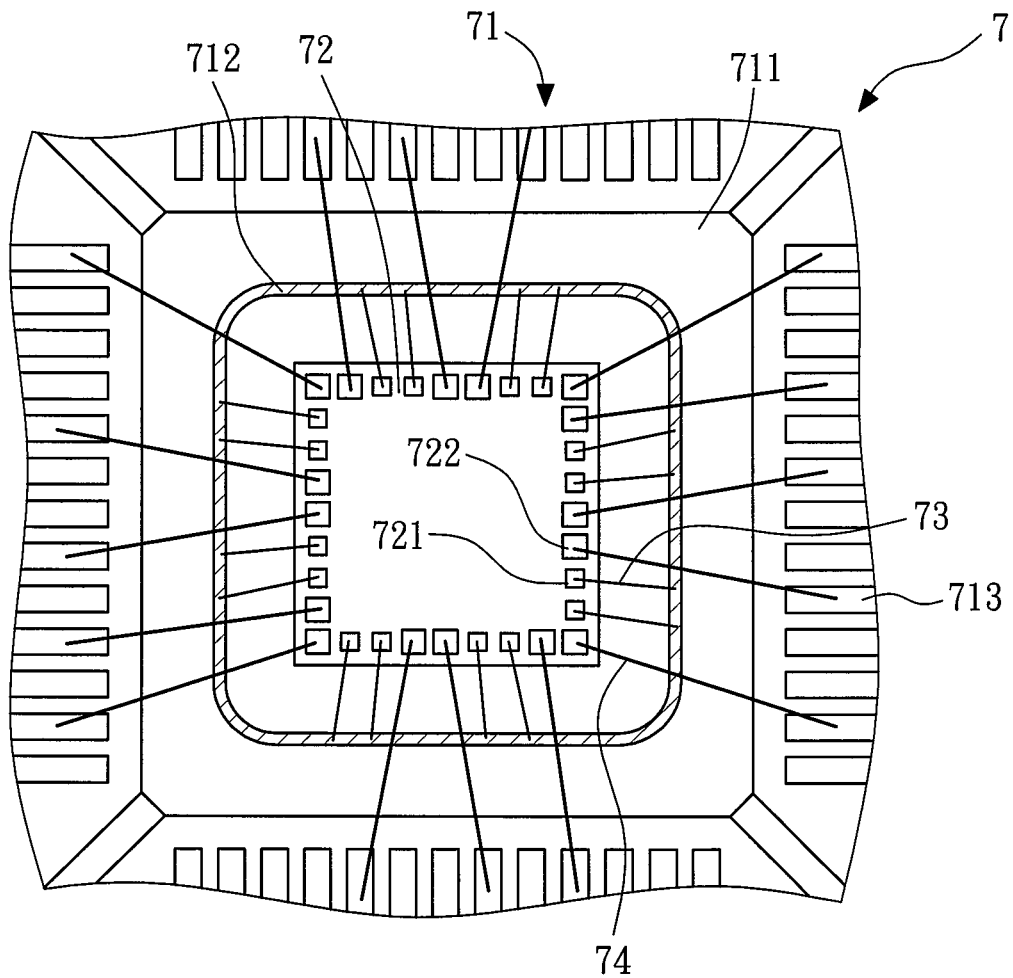
FIG. 12 is a schematic top view of a semiconductor package according to example 8 of the present invention without the molding compound.
Figure 13:
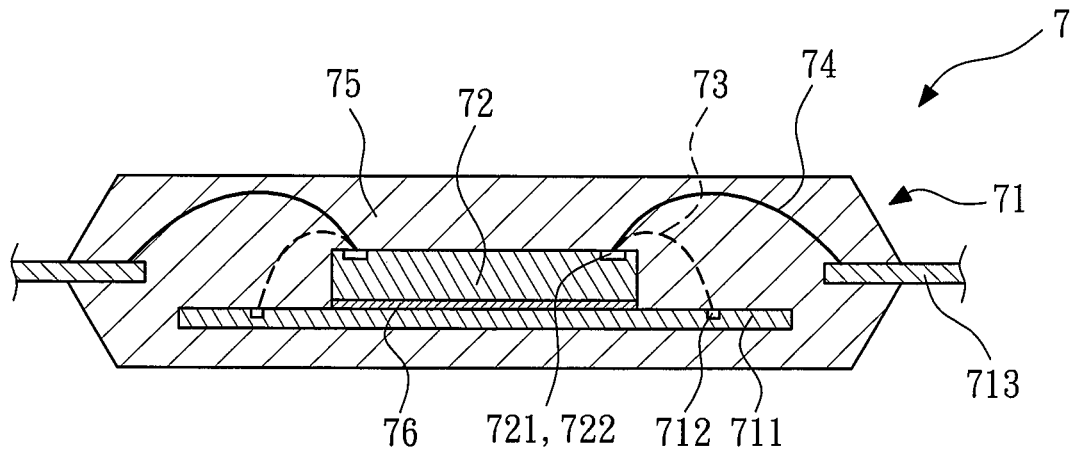
FIG. 13 is a schematic cross-sectional view of a semiconductor package according to example 8 of the present invention.

FIG. 12 shows a top view of a semiconductor package according to example 8 of the present invention without the molding compound. FIG. 13 shows a cross-sectional view of a semiconductor package according to example 8 of the present invention. The semiconductor package 7 comprises a leadframe 71, a die 72, a plurality of first wires 73, a plurality of second wires 74 and a molding compound 75.

The leadframe 71 has a die pad 711, a first electrically connecting portion and a second electrically connecting portion. In the example, the first electrically connecting portion is a ground ring 712, and it is disposed on the die pad 711. The second electrically connecting portion is a plurality of leads 713. The leads 713 surround the die pad 711.

The die 72 is adhered to the die pad 711 by an adhesive 76. The upper surface of the die 72 has a plurality of first pads 721 and a plurality of second pads 722. The areas of the first pads 721 are smaller than those of the second pads 722. However it is understood that the areas of the first pads 721 may also be equal to those of the second pads 722.

The first wires 73 electrically connect the first pads 721 and the ground ring 712, and each of the first wires 73 has a first length. The second wires 74 electrically connect the second pads 722 and the leads 713, and each of the second wires 74 has a second length. The second length is larger than the first length, and the diameters of the second wires 74 are larger than those of the first wires 73. The molding compound 75 encapsulates the leadframe 71, the die 72, the first wires 73, the second wires 74, the ground ring 712, the leads 713, the first pads 721 and the second pads 722.

Example 9

Figure 14:
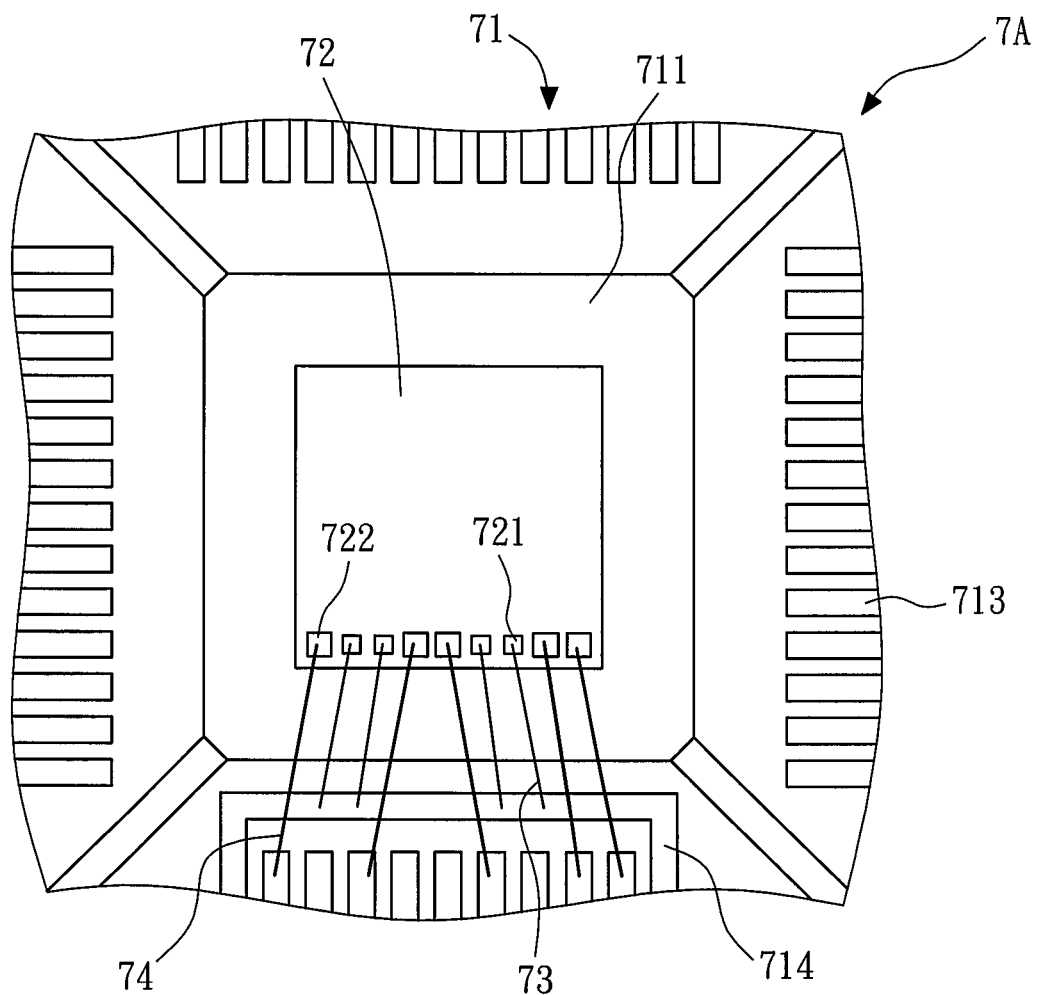
FIG. 14 is a schematic top view of a semiconductor package according to example 9 of the present invention without the molding compound.

FIG. 14 shows a top view of a semiconductor package according to example 9 of the present invention without the molding compound. The semiconductor package 7A of the example is substantially the same as the semiconductor package 7 of example 8, except for the form of the ground ring. In the example, the ground ring 714 is in the form of a lead, rather than disposed on the die pad 711.

Example 10

Figure 15:
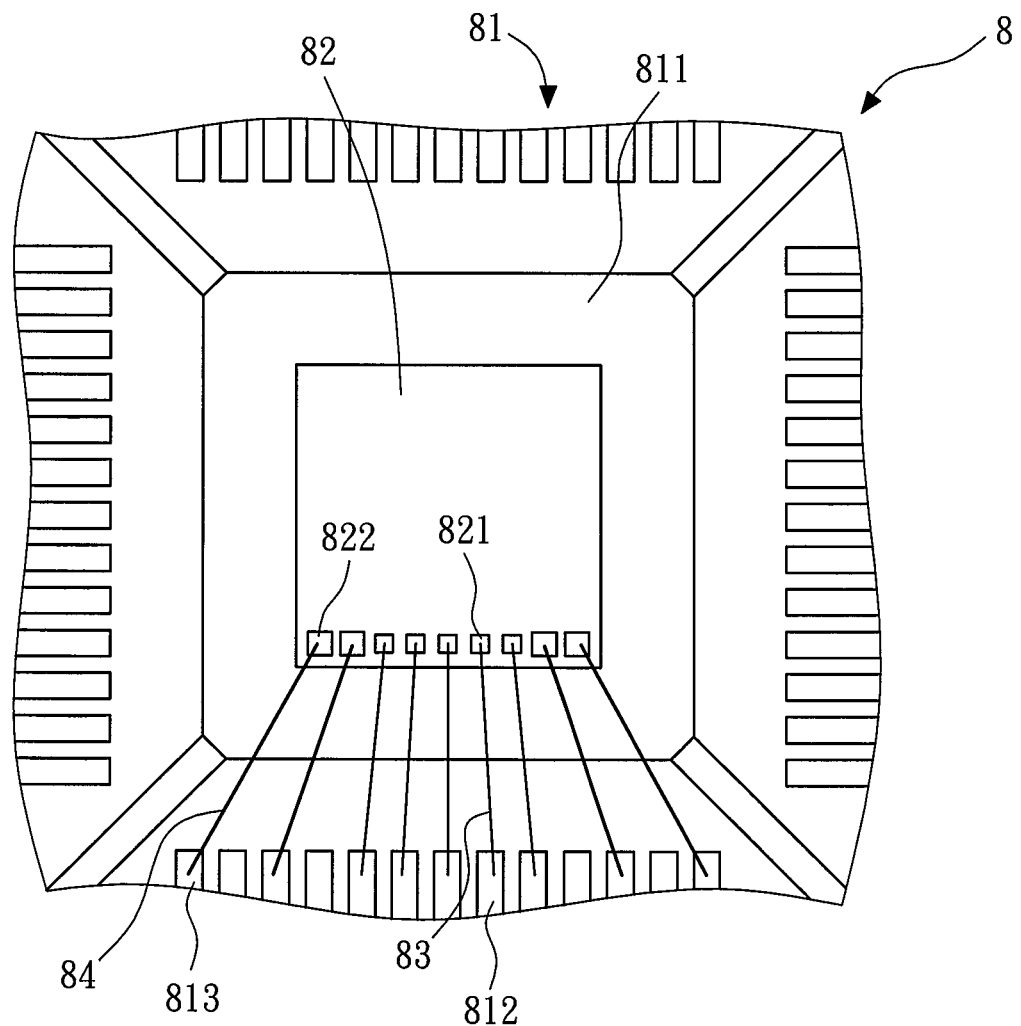
FIG. 15 is a schematic top view of a semiconductor package according to example 10 of the present invention without the molding compound.

FIG. 15 shows a top view of a semiconductor package according to example 10 of the present invention without the molding compound. The semiconductor package 8 comprises a leadframe 81, a die 82, a plurality of first wires 83, a plurality of second wires 84 and a molding compound (not shown).

The leadframe 81 has a die pad 811, a first electrically connecting portion and a second electrically connecting portion. In the example, the first electrically connecting portion is a plurality of first leads 812. The second electrically connecting portion is a plurality of second leads 813.

The upper surface of the die 82 has a plurality of first pads 821 and a plurality of second pads 822. The areas of the first pads 821 are smaller than those of the second pads 822. However it is understood that the areas of the first pads 821 may also be equal to those of the second pads 822.

The first wires 83 electrically connect the first pads 821 and the first leads 812, and each of the first wires 83 has a first length. The second wires 84 electrically connect the second pads 822 and the second leads 813, and each of the second wires 84 has a second length. The second length is larger than the first length, and the diameters of the second wires 84 are larger than those of the first wires 83.

Example 11

Figure 16:
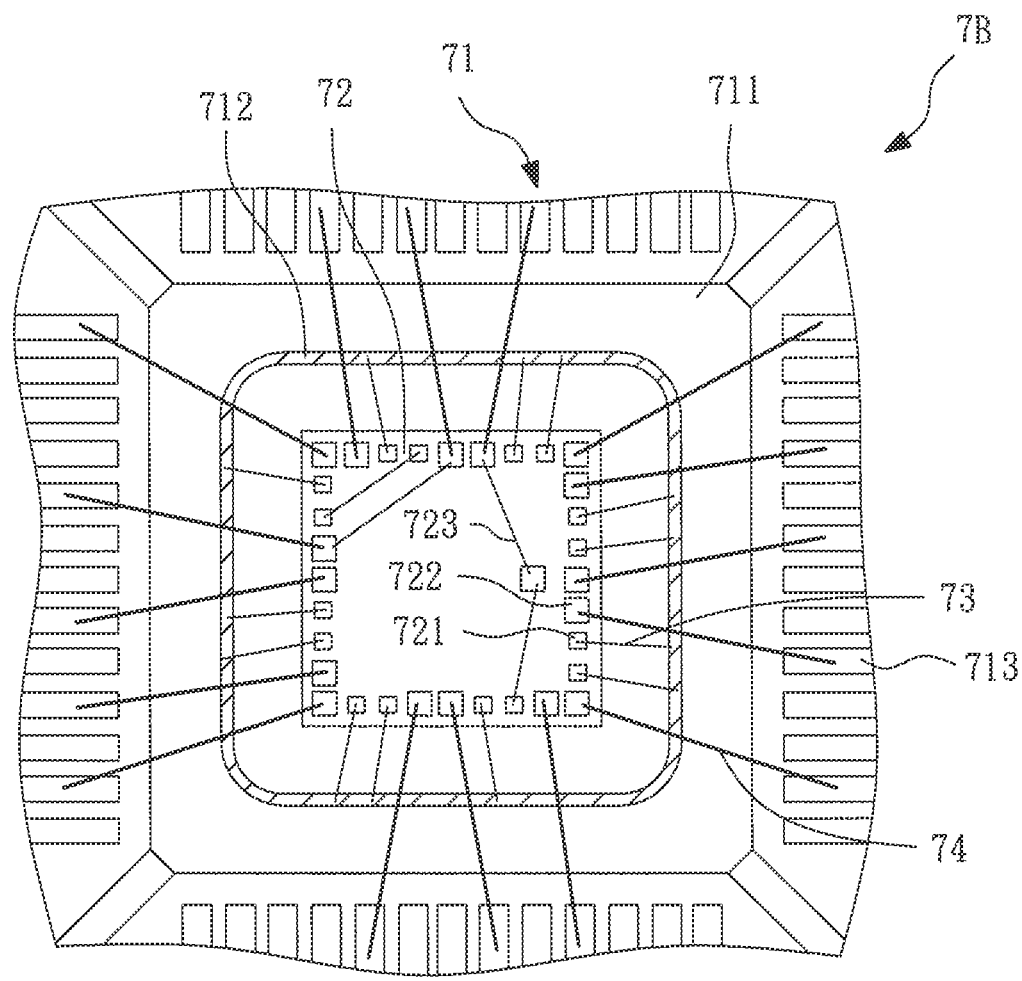
FIG. 16 is a schematic top view of a semiconductor package according to example 11 of the present invention without the molding compound.
Figure 17:
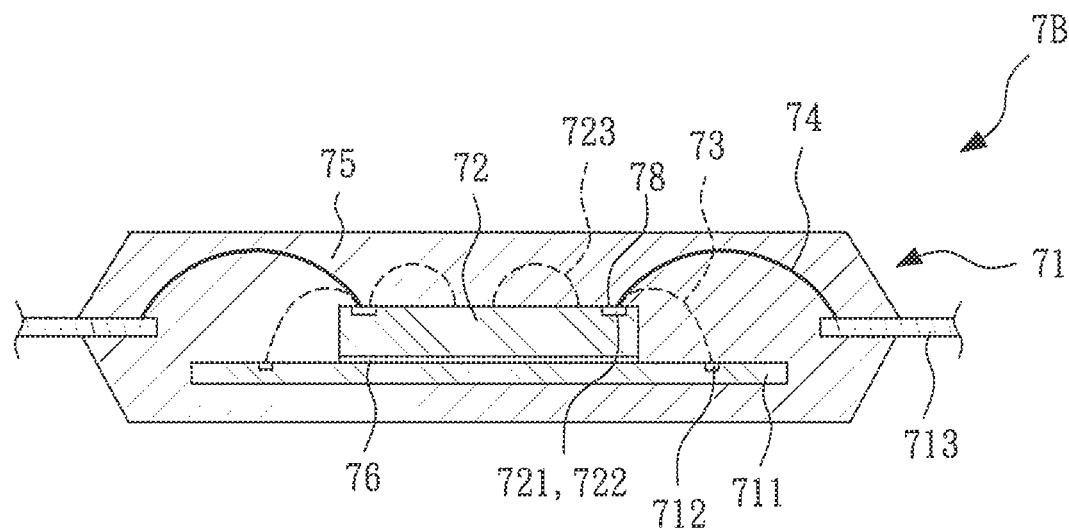
FIG. 17 is a schematic cross-sectional view of a semiconductor package according to example 11 of the present invention.

FIG. 16 shows a top view of a semiconductor package according to example 11 of the present invention without the molding compound. FIG. 17 shows a cross-sectional view of a semiconductor package according to example 11 of the present invention. Referring to FIG. 16, the semiconductor package 7B of the example is substantially the same as the semiconductor package 7 of example 8 (FIGS. 12 and 13), except that the semiconductor package 7B further comprises a plurality of internal wires 723. The internal wire 723 electrically connects two of the pads (the first pads 721 or the second pads 722) of the die 72, and the diameter of the internal wire 723 is different from that of the second wire 74. In the embodiment, the diameter of the internal wire 723 may be different from or equal to that of the first wire 73. The materials of the internal wire 723, the first wire 73 and the second wire 74 may be gold or copper.

Referring to FIG. 17, the semiconductor package 7B comprises a leadframe 71, a die 72, a plurality of first wires 73, a plurality of second wires 74, a plurality of internal wires 723 and a molding compound 75.

The leadframe 71 has a die pad 711, a first electrically connecting portion and a second electrically connecting portion. In the example, the first electrically connecting portion is a ground ring 712, and it is disposed on the die pad 711. The second electrically connecting portion is a plurality of leads 713. The leads 713 surround the die pad 711.

The die 72 is adhered to the die pad 711 by an adhesive 76. The upper surface of the die 72 has a plurality of first pads 721 and a plurality of second pads 722. The areas of the first pads 721 are smaller than those of the second pads 722. However it is understood that the areas of the first pads 721 may also be equal to those of the second pads 722. Preferably, each of the first pads 721 and each of the second pads 722 has a surface finish 78 on the top surface thereof. The surface finish 78 would be of gold, gold alloy, silver, silver alloy, palladium and alloys thereof, noble metals and alloys thereof, nickel and alloys thereof, nickel and gold alloys, zincated copper, etc.

The first wires 73 electrically connect the first pads 721 and the ground ring 712, and each of the first wires 73 has a first length. The second wires 74 electrically connect the second pads 722 and the leads 713, and each of the second wires 74 has a second length. The second length is larger than the first length, and the diameters of the second wires 74 are larger than those of the first wires 73.

The internal wire 723 electrically connects two of the pads (the first pads 721 or the second pads 722) of the die 72, and the diameter of the internal wire 723 is different from that of the second wire 74. In the embodiment, the diameter of the internal wire 723 may be different from or equal to that of the first wire 73.

The molding compound 75 encapsulates the leadframe 71, the die 72, the first wires 73, the second wires 74, the internal wire 723, the ground ring 712, the leads 713, the first pads 721 and the second pads 722.

Example 12

Figure 18:
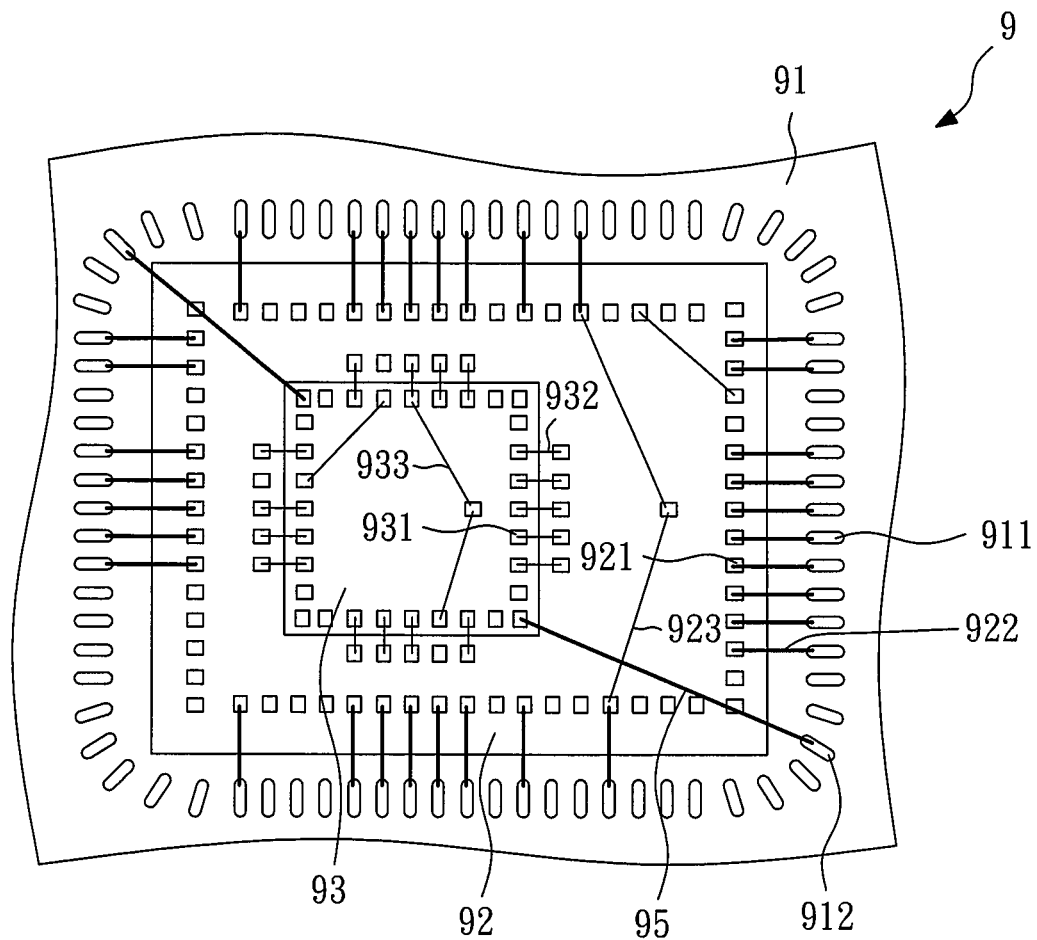
FIG. 18 is a schematic top view of a semiconductor package according to example 12 of the present invention without the molding compound.
Figure 19:
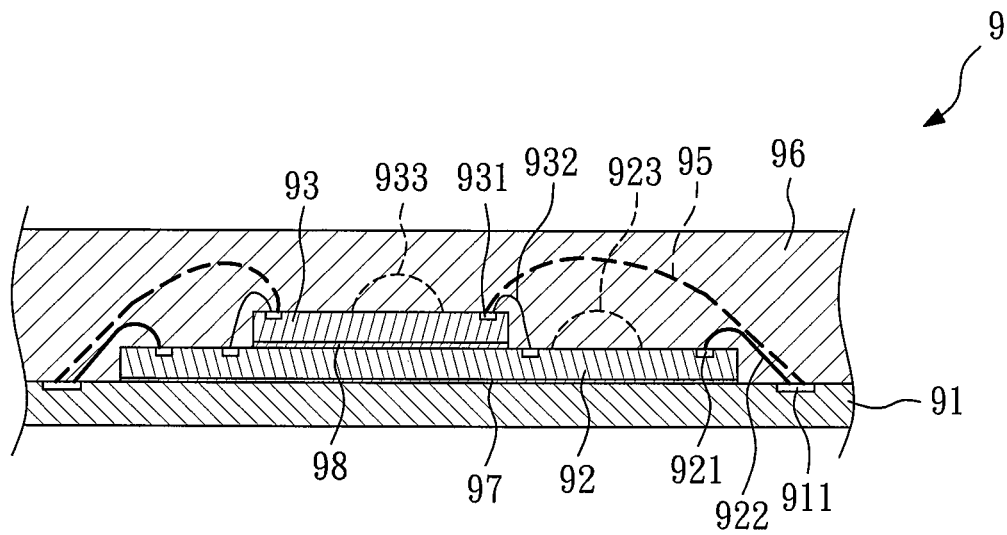
FIG. 19 is a schematic cross-sectional view of a semiconductor package according to example 12 of the present invention.

FIG. 18 shows a top view of a semiconductor package according to example 12 of the present invention without the molding compound. FIG. 19 shows a cross-sectional view of a semiconductor package according to example 12 of the present invention. Referring to FIG. 18, the semiconductor package 9 comprises a carrier (substrate 91), a first semiconductor device (first die 92), a first external wire 922, a first internal wire 923, a second semiconductor device (second die 93), a second external wire 932 and a second internal wire 933.

The substrate 91 has a first electrically connecting portion 911 and a second electrically connecting portion 912. In the example, the first electrically connecting portion 911 and the second electrically connecting portion 912 are fingers.

The first external wire 922 electrically connects one of the first pads 921 of the first die 92 and the first electrically connecting portion 911 of the substrate 91.

The first internal wire 923 electrically connects two of the first pads 921 of the first die 92. The diameter of the first internal wire 923 is different from that of the first external wire 922. In the example, the diameter of the first external wire 922 is larger than that of the first internal wire 923. The materials of the first internal wire 923 and the first external wire 922 may be gold or copper.

The second die 93 has a plurality of second pads 931. The second external wire 932 electrically connects one of the second pads 931 of the second die 93 and one of the first pads 921 of the first die 92. The diameter of the second external wire 932 is different from that of the first external wire 922. The diameter of the first internal wire 923 may be different from or equal to that of the second external wire 932. The material of the second external wire 932 may be gold or copper. In this embodiment, the first internal wire 923 and the second external wire 932 electrically connect different first pads 921 of the first die 92 respectively. That is, the first internal wire 923 and the second external wire 932 do not electrically connect same first pads 921, thus, an indirect electrical connection is formed between the substrate 91 and the second die 93.

The second internal wire 933 electrically connects two of the second pads 931 of the second die 93. The diameter of the second internal wire 933 may be different from or equal to that of the second external wire 932. The material of the second internal wire 933 may be gold or copper.

Preferably, the semiconductor package 9 further comprises a third wire 95. The third wire 95 connects one of the second pads 931 of the second die 93 and the second electrically connecting portion 912 of the substrate 91. The material of the third wire 95 may be gold or copper. The diameter of the third wire 95 may be different from or equal to that of the first external wire 922.

Referring to FIG. 19, the semiconductor package 9 comprises a carrier (substrate 91), a first semiconductor device (first die 92), a first external wire 922, a first internal wire 923, a second semiconductor device (second die 93), a second external wire 932, a second internal wire 933 and a molding compound 96.

The substrate 91 has a first electrically connecting portion 911 and a second electrically connecting portion 912. In the example, the first electrically connecting portion 911 and the second electrically connecting portion 912 are fingers.

The first die 92 is disposed on the substrate 91 and has a plurality of first pads 921. In the example, the first die 92 is adhered to the substrate 91 by a first adhesive 97. The first external wire 922 electrically connects one of the first pads 921 of the first die 92 and the first electrically connecting portion 911 of the substrate 91. Preferably, each of the first pads 921 has a surface finish on the top surface thereof. The surface finish would be of gold, gold alloy, silver, silver alloy, palladium and alloys thereof, noble metals and alloys thereof, nickel and alloys thereof, nickel and gold alloys, zincated copper, etc.

The first internal wire 923 electrically connects two of the first pads 921 of the first die 92. The diameter of the first internal wire 923 is different from that of the first external wire 922. In the example, the diameter of the first external wire 922 is larger than that of the first internal wire 923. The materials of the first internal wire 923 and the first external wire 922 may be gold or copper.

The second die 93 is disposed on the first die 92 and has a plurality of second pads 931. In the example, the second die 93 is adhered to the first die 92 by a second adhesive 98. The second external wire 932 electrically connects one of the second pads 931 of the second die 93 and one of the first pads 921 of the first die 92. The diameter of the second external wire 932 is different from that of the first external wire 922. The diameter of the first internal wire 923 may be different from or equal to that of the second external wire 932. The material of the second external wire 932 may be gold or copper. Preferably, each of the second pads 931 has a surface finish on the top surface thereof.

The second internal wire 933 electrically connects two of the second pads 931 of the second die 93. The diameter of the second internal wire 933 may be different from or equal to that of the second external wire 932. The material of the second internal wire 933 may be gold or copper.

Preferably, the semiconductor package 9 further comprises a third wire 95. The third wire 95 connects one of the second pads 931 of the second die 93 and the second electrically connecting portion 912 of the substrate 91. The material of the third wire 95 may be gold or copper. The diameter of the third wire 95 may be different from or equal to that of the first external wire 922.

The molding compound 96 encapsulates the first electrically connecting portion 911, the second electrically connecting portion 912, the first die 92, the second die 93, the first external wire 922, the first internal wire 923, the second external wire 932, the second internal wire 933 and the third wire 95.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms as illustrated, and that all modifications which maintain the spirit and scope of the present invention are within the scope defined in the appended claims.

What is claimed is:

1. A semiconductor package, comprising:
   a carrier, having a first electrically connecting portion and a second electrically connecting portion;
   a semiconductor device, having a plurality of pads, wherein the pads comprise a first pad and a second pad and wherein the area of the first pad is smaller than that of the second pad;
   a first wire, having a first length, and electrically connecting the first pad to the first electrically connecting portion of the carrier
   a second wire, having a second length, and electrically connecting the second pad to the second electrically connecting portion of the carrier, wherein the diameter of the second wire is larger than that of the first wire; and
   an internal wire, electrically connecting two of the pads of the semiconductor device, wherein the diameter of the internal wire is different from that of the first wire.

2. The semiconductor package as claimed in claim 1, wherein the second length is larger than the first length, and the diameter of the internal wire is different from that of the second wire.

3. The semiconductor package as claimed in claim 2, wherein the first electrically connecting portion is a first finger, the second electrically connecting portion is a second finger, the first wire is connected to the first finger, and the second wire is connected to the second finger.

4. The semiconductor package as claimed in claim 1, wherein each of the pads has a surface finish on the top surface thereof.

5. A semiconductor package, comprising:
   a carrier, having a first electrically connecting portion and a second electrically connecting portion;
   a first semiconductor device, disposed on the carrier and having a plurality of first pads and a plurality of second pads, wherein the area of the first pad is smaller than that of the second pad;
   a first external wire, having a first length, and electrically connecting the first pads to the first electrically connecting portion of the carrier;
   a second external wire, having a second length, and electrically connecting the second pad to the second electrically connecting portion of the carrier, wherein the diameter of the second wire is larger than that of the first wire;
   a first internal wire, electrically connecting two of the first pads of the first semiconductor device, and the diameter of the first internal wire being different from that of the first external wire;
   a second semiconductor device, disposed on the first semiconductor device and having a plurality of third pads; and
   a third external wire, electrically connecting one of the third pads of the second semiconductor device and one of the first pads of the first semiconductor device.

6. The semiconductor package as claimed in claim 5, wherein the diameter of the first internal wire is different from that of the third external wire.

7. The semiconductor package as claimed in claim 5, wherein the diameter of the first internal wire is equal to that of the third external wire.

8. The semiconductor package as claimed in claim 5, further comprising a second internal wire electrically connecting two of the second pads of the second semiconductor device.

9. The semiconductor package as claimed in claim 8, wherein the diameter of the second internal wire is equal to that of the third external wire.

10. The semiconductor package as claimed in claim 5, further comprising a molding compound for encapsulating the first electrically connecting portion, the second electrically connecting portion, the first semiconductor device, the second semiconductor device, the first external wire, the second external wire, the first internal wire and the third external wire.

11. The semiconductor package as claimed in claim 5, wherein the diameter of the third external wire is different from that of the first external wire.

12. A semiconductor package, comprising:
a carrier, having a first electrically connecting portion;
a first semiconductor device, disposed on the carrier and having a plurality of first pads and a plurality of second pads, wherein the area of the first pad is smaller than that of the second pad;
a first external wire, having a first length, and electrically connecting the first pads to the first electrically connecting portion of the carrier;
a second external wire, having a second length, and electrically connecting the second pad to the second electrically connecting portion of the carrier, wherein the diameter of the second wire is larger than that of the first wire;
a first internal wire, electrically connecting two of the first pads of the first semiconductor device, and the diameter of the first internal wire being different from that of the first external wire;
a second semiconductor device, disposed on the first semiconductor device and having a plurality of third pads; and
a third external wire, electrically connecting one of the second pads of the second semiconductor device and one of the first pads of the first semiconductor device,
wherein the first internal wire and the third external wire electrically connect different first pads of the first semiconductor device respectively.

13. The semiconductor package as claimed in claim 12, wherein the diameter of the first internal wire is different from that of the third external wire.

14. The semiconductor package as claimed in claim 12, wherein the diameter of the first internal wire is equal to that of the third external wire.

15. The semiconductor package as claimed in claim 12, further comprising a second internal wire electrically connecting two of the second pads of the second semiconductor device.

16. The semiconductor package as claimed in claim 15, wherein the diameter of the second internal wire is equal to that of the third external wire.

17. The semiconductor package as claimed in claim 12, further comprising a molding compound for encapsulating the first electrically connecting portion, the second electrically connecting portion, the first semiconductor device, the second semiconductor device, the first external wire, the second external wire, the first internal wire and the third external wire.

18. The semiconductor package as claimed in claim 12, wherein the diameter of the third external wire is different from that of the first external wire.

* * * * *